United States Patent [19]

DeBolt et al.

[11] 4,358,473

[45] Nov. 9, 1982

[54] PROCESS CONTROL SYSTEM

[75] Inventors: Harold E. DeBolt, Boulder, Colo.; Joseph Morrissey, Dracut; Raymond J. Suplinskas, Haverhill, both of Mass.

[73] Assignee: Avco Corporation, Wilmington, Mass.

[21] Appl. No.: 266,435

[22] Filed: May 22, 1981

[51] Int. Cl.³ .............................................. B05D 5/00
[52] U.S. Cl. ........................................ 427/10; 427/52; 427/120; 427/249; 427/251; 427/255.2; 427/255.5; 427/255.7; 118/665; 118/620; 118/718; 118/725
[58] Field of Search ............... 118/665, 620, 718, 725; 427/10, 249, 251, 255.2, 255.5, 255.7, 52, 111, 120

[56]     References Cited
        U.S. PATENT DOCUMENTS

| | | | |
|---|---|---|---|
| 3,356,529 | 12/1967 | Kiser et al. | 118/725 |
| 3,539,963 | 11/1970 | Schrader | 118/718 |
| 3,572,286 | 3/1971 | Forney | 118/725 |
| 3,846,224 | 11/1974 | Leclercq et al. | 428/338 |
| 3,907,607 | 9/1975 | Chu et al. | 118/718 |
| 4,031,851 | 6/1977 | Camahort | 118/718 |
| 4,068,037 | 1/1978 | Debolt et al. | 427/228 |
| 4,300,094 | 11/1981 | Piso et al. | 427/10 |

OTHER PUBLICATIONS

Vossen et al., Thin Film Processes, 1978, Academic Press, NY, NY, pp. 287–289.

Primary Examiner—Michael R. Lusignan
Assistant Examiner—Richard Bueker
Attorney, Agent, or Firm—Abraham Ogman

[57]                 ABSTRACT

This invention relates to a process control system and method of controlling a chemical vapor deposition (CVD) process where a coating is deposited on a substrate heated by passing a current through the substrate to create a heating zone. The control system relies on detecting a signal induced on the coated substrate outside of the heating zone and using the induced signal to control one or more process parameters.

12 Claims, 3 Drawing Figures

PROCESS CONTROL SYSTEM

BRIEF SUMMARY OF THE INVENTION

This invention is concerned with a process control system for controlling chemical vapor deposition (CVD) processes. In particular it is concerned with CVD processes for making or coating filaments.

CVD processes have been widely utilized to make and/or treat high-modulus, high-strength filaments, such as boron filaments and silicon carbide filaments. In addition, these basic filaments are often treated by depositing additional thin coatings on these filaments in order to modify or enhance specific properties of these filaments. For example, U.S. Pat. No. 3,846,224 discloses a process for depositing a boron carbide coating on boron filament. A filament coating in the trade under the name of "Borsic" is a boron filament with a thin silicon carbide coating applied to the exterior surface of boron filament.

U.S. Pat. No. 4,068,037 discloses the use of a carbon-rich silicon carbide layer on a silicon carbide filament for the purpose of improving the strength of the filament.

It will be noted in patents and other literature describing processes for making these very delicate high-modulus, high-strength filaments that CVD process parameters are generally closely regulated in order to maintain the quality of the filament. This invention deals with a process control system wherein the control capability is derived from electrical signals induced within the coated substrate. At this time the point must be made that the phenomenon which produces such induced voltages is not understood. The voltages, however, are capable of being detected and used to control process parameters.

It is an object of the invention to provide a process control system for controlling one or more process parameters associated with CVD reactors.

It is another object of the invention to provide a process control system for CVD reactors used to make and/or treat filament substrates.

It is still another object of the invention to provide a process control system for depositing boron carbide ($B_4C$) on a boron filament substrate.

It is still another object of the invention to provide a process control system for making silicon carbide filaments.

It is yet another object of the invention to provide a method for controlling one or more process parameters in CVD reactors, and in particular, CVD reactors for making continuous filaments.

It is yet another object of the invention to provide a method of controlling the CVD process utilized to make and/or treat boron and silicon carbide filaments.

In accordance with the invention, a process control system for a CVD reactor system for depositing a coating on a filament substrate is provided. In general a continuous filament moves through a reaction chamber wherein a heating zone is established by passing an electric current through the substrate filament. The process control system also includes a pair of electrodes, at least one of which is outside of the heating zone. A voltage detector is coupled to the pair of electrodes for detecting a voltage induced between the electrodes. A means for generating a control voltage in response to the induced voltage is coupled to the voltage detection means, and means responsive to the control means is used to control metering valves or other such devices for controlling process parameters.

The invention also includes a method for controlling a CVD process whereby the induced voltage is coupled to a control means for generating a control signal, and the control signal is, in turn, used to control process parameters.

The novel features that are considered characteristic of the invention are set forth in the appended claims; the invention itself, however, both as to its organization and method of operation, together with additional objects and advantages thereof, will best be understood from the following description of a specific embodiment when read in conjunction with the accompanying drawings, in which:

DETAILED DESCRIPTION OF THE PREFERRED EMBODIMENT

Classically, CVD processes are used to make and/or treat boron and silicon carbide filaments, in particular. Typically, a continuous filamentary core is passed through a reactor in which a heated reaction zone is developed. Reagents, such as boron halides for boron and methylchlorosilanes for silicon carbide, are supplied to the reactor where upon contact with the heated filament, they dissociate and deposit on the filament either boron or silicon carbide. This basic process includes many variations; for example, a buffer layer may be deposited between the core and the boron or silicon carbide layer. Additionally, external coatings are often deposited on the surface of the boron or silicon carbide layer. The character of the buffer layer, the exterior layer, and even the main boron or silicon deposit can be altered by varying the speed at which the filament traverses the reactor, the deposition temperatures, and the blend of materials used to form the essential deposit.

The aforementioned U.S. Pat. No. 3,846,224 discloses a multi-reactor process wherein the filament passes through two or more separate and distinct reactors. U.S. Pat. No. 4,068,037 discloses the use of a single reactor to form multiple deposits. This invention will be described in relation to a single $B_4C$ reactor configuration, it being assumed that a boron filament is the feedstock to the $B_4C$ reactor. The control system may be used at the end of a multi-stage system wherein a substrate deposit and a coating are developed in a continuous sequence.

The deposition parameters, such as filament speed, deposition temperature, reagent blends, etc. do not deviate in this invention from the conditions described in one or more of the patents referred to above. This invention deals with ways of controlling these parameters.

Figure 1:
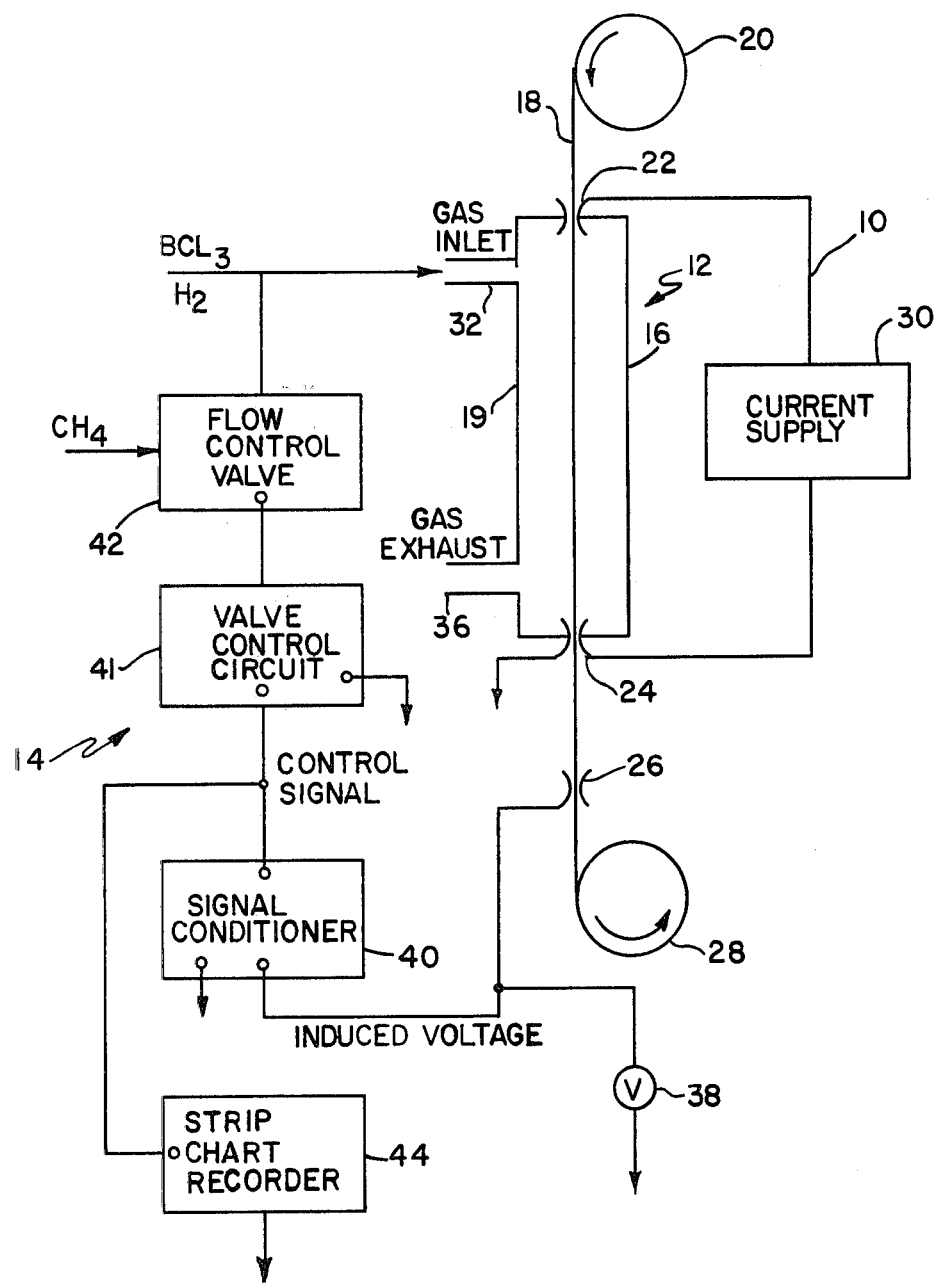
FIG. 1 is a schematic representation of one form of a CVD reactor combined with a schematic representation of the process control system.

Referring to FIG. 1, there is shown at 10 a CVD reactor 12, together with a process control system 14. The CVD reactor 12 includes a closed reactor vessel 16. A substrate filament 18, such as tungsten, carbon monofilament, or boron etc. is obtained from a supply reel 20 and is fed into the reactor core 16 through mercury electrode 22. The filament 18 traverses the length of the reactor vessel 16 and exits by means of a mercury electrode 24.

It then passes through a third mercury electrode 26 before it is wound up on a take-up roll 28. The filament enters the reactor as a core and leaves the reactor with one or more coatings. The mercury electrodes 22 and 24 are coupled to a current supply means 30. The current supply means 30 couples current to the electrode 22 through the length of the filament between the electrodes 22 and 24 back to the current supply means 30. The terminal 24 is depicted as a ground terminal in FIG. 1.

The length of the filament 18 between the electrodes 22 and 24 represents a reaction zone 19. The current flowing through this zone is adjusted until the filament is heated to the desired deposition temperatures. Electrode 26 is outside of the reaction zone.

The reactor vessel 16 also includes a gas inlet 32 for supplying a blend of reactants to the reaction zone. Typically, such reactants will include boron trichloride ($BCl_3$) or other boron halides in combination with hydrogen and a hydrocarbon where a $B_4C$ plating is to be developed on a boron filament. Somewhat analagously, a blend of dimethylchlorosilanes is supplied to a conventional reactor to form silicon carbide filaments. A gas outlet 36 for withdrawing reactants from the reactor is also provided.

The process control system embodied in this invention includes a voltmeter 38 coupled to the third electrode 26 for detecting a voltage induced within the filament between electrode 26 and the current electrode 24. An alternative construction would be to provide a fourth electrode positioned between electrodes 24 and 26, if desired.

The voltmeter 38 is coupled to a signal conditioning means 40. The induced voltage signal is modified and formed into a control signal. The control signal leaves the signal conditioning means 40 and is coupled to a flow control valve 42 via a valve control circuit 41. The flow control valve regulates the flow of hydrocarbon to the gas inlet 32.

It is obvious that the control signal and similar control means can be used to control the flow of reactants into gas inlet 32 or to control the magnitude of the current from the control supply means to the heating zone or to control the speed of the filament through the reactor or any combination of these. For the purpose of this discussion, it will be assumed that a $B_4C$ coating is to be deposited on a boron filament. To achieve this, methane is supplied through the flow control valve 42 into gas inlet 32 and into the reactor vessel 16. It has been determined that the most critical parameter relative to controlling filament quality is the percent of carbon in the plating gas. Some carbon is supplied via the $BCl_3$ because it mixes the recycled $BCl_3$ generally in the form of methylboranes. The flow of $CH_4$ was chosen to adjust the carbon content. Clearly, a similar setup can be provided for controlling the flow of hydrogen to the reaction zone either alone or in combination with controlled quantities of a hydrocarbon.

Figure 2:
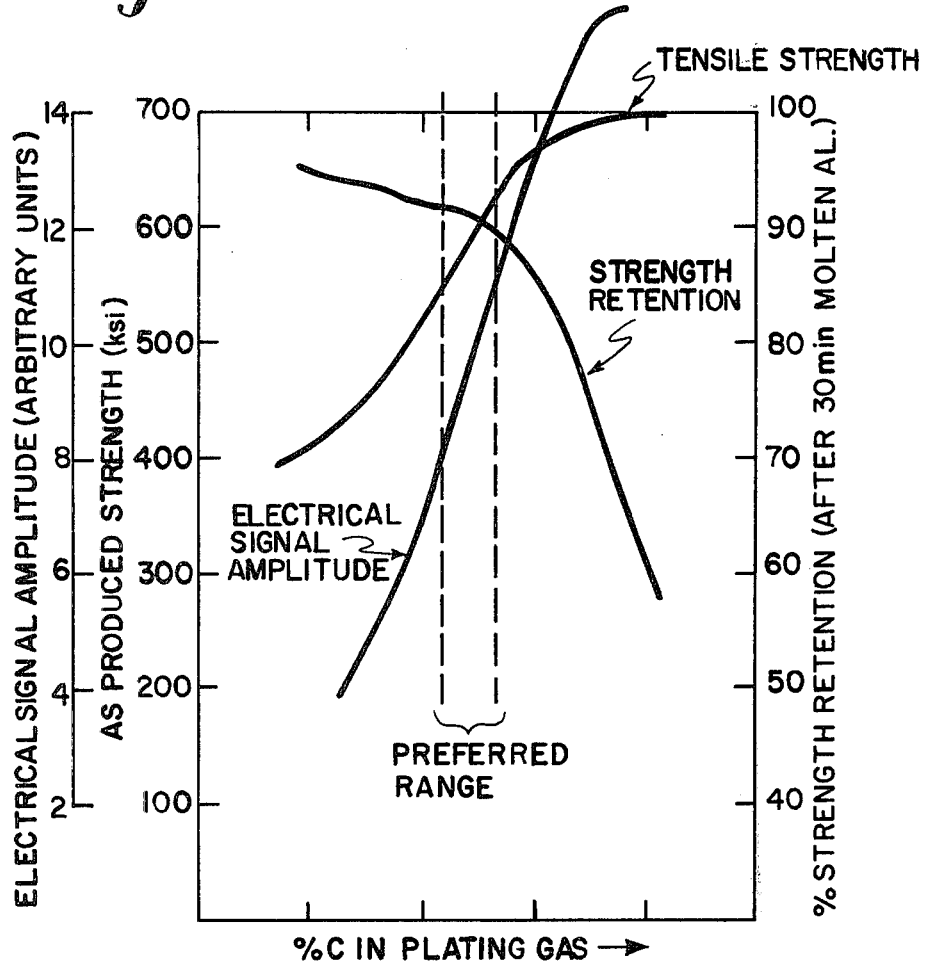
FIG. 2 contains curves which show how electrical signals and filament properties vary with the total carbon content of the plating gas.

In the process of providing such a $B_4C$ coating, it was observed that an electrical signal of up to 2 megahertz in frequency, which, for purposes of this discussion we will call an induced voltage, occurs when an electrode, such as electrode 26, is coupled to the filament outside of the reaction zone. It is not known what causes this voltage. What is known, however, is that as one or more of the process parameters are varied, the voltage varies when controlling the flow of methane. It was observed that where the magnitude of the voltage was below a lower threshold, the filament was very weak and unsatisfactory. On the other hand, when the induced voltage was greater than an upper threshold level, the filament did not withstand the debilitating action of molten aluminum. In fact, the upper and lower thresholds represented a very narrow window. So long as the system was operated within this narrow window, an excellent $B_4C$ coated boron filament was produced. The variations of these properties as a function of these parameters are illustrated in FIG. 2.

The operation of the system shown in FIG. 1 is as follows. A boron filament 18 is drawn through the reactor 12 where it is heated to deposition temperatures by the passage of a DC electrical current from current supply 30. Within the reaction zone of the reactor is a plating gas comprised primarily of $BCl_3$, $H_2$, and $CH_4$. Minor constituents in the gas may include diborane and alkyl boranes. Under these conditions a boron carbide coating is deposited on the filament. Induced electrical impulses are produced during the deposition process and are sensed and detected by the sensing electrode 26 and the voltmeter 38. The induced signals are appropriately conditioned in signal conditioning means 40, and a resulting control signal is coupled to a logic circuit 41 which determines whether the amplitude is below, within, or above the preferred range. If the amplitude is outside the preferred range, a logic module activates a flow control valve 42 which changes the carbon-to-hydrogen ratio in the gas entering the gas inlet 32 in a direction which will bring the reactor back to within the specified operating parameters. Many types of control circuits are possible. In the present case we use a motorized micrometering valve on the $CH_4$ inlet. The logic circuit 41, in combination with the flow control valve 42, makes an incremental change in the gas flow, then pauses until the effects of this change appear at the sensing electrode 26. If further correction is needed, the cycle is repeated until the proper flow of $CH_4$ is reached.

The induced signal detected at the sensing electrode 26 can also be used to provide a permanent, continuous record of the filament characteristics. For example, appropriately conditioned signals could be directed to the strip chart recorder 44. Because of the one-to-one correspondence between the amplitude of the induced signal and filament strength and resistance to metallic matrix materials, such a recording provides a continuous evaluation of the quality of the coated filament, eliminating the need for extensive testing after the production process.

The invention is not limited to the production of boron carbide coatings on boron. A similar electrical phenomenon occurs during the chemical vapor deposition of silicon carbide on a carbon substrate and is related to the concentration of nitrogen and oxygen in the plating gas mixture. Further, a similar phenomenon occurs during the deposition of boron carbide on silicon carbide.

Figure 3:
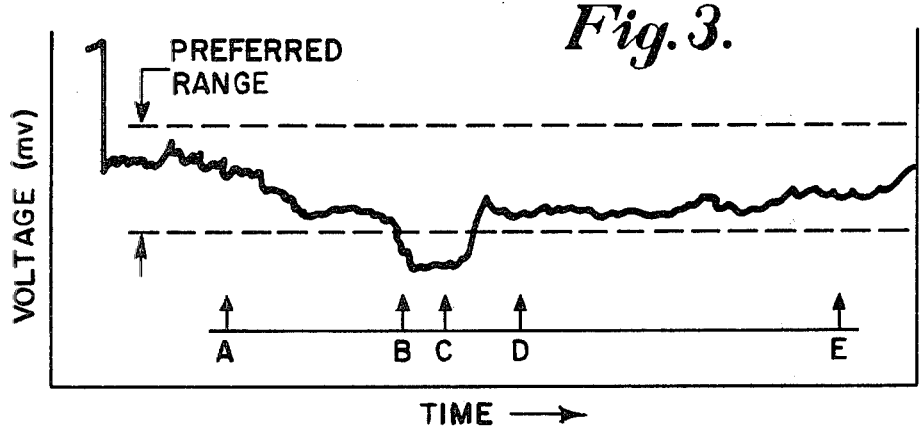
FIG. 3 shows a representative recording of electrical signals as a function of time.

The advantages of the invention can be seen from the following example. FIG. 3 shows a portion of a strip chart recording of the electrical impulses produced during the operation of a reactor producing boron carbide coatings on boron. The preferred range of operating conditions corresponds to the range of electrical impulses shown on the Figure. At time A, for example, the filament produced possessed the preferred characteristics as shown in Table 1 below. At time B, a fluctuation in operating conditions caused the reactor to deviate from the preferred conditions; the largest deviation occured at time C. By time D, the automatic control system had increased the methane flow so that the filament again had the preferred qualities. Operation continued within the preferred range, including time E. (It should be noted that the fluctuation shown in the example is large in comparison with what is normally observed during operation of a coating reactor). Table 1 shows that the preferred range of operating conditions were resumed automatically by the system, and further, that the recording of the electrical impulses provides the information necessary to determine the quality of the filament.

TABLE 1

| Sample | As-Produced Properties (Ksi) | | Percent Retention of Properties after Molten Aluminum Exposure | |
|---|---|---|---|---|
| | Tensile Strength | Surface Strength | Tensile | Surface |
| A | 554 | 806 | 87% | 88% |
| B | 483 | 800 | 94% | 92% |
| C | 227 | 410 | 94% | 93% |
| D | 571 | 806 | 79% | 88% |
| E | 546 | 800 | 76% | 87% |

Table 1 indicates the properties of the coated boron filament as produced and the percent of these properties retained after exposure to molten aluminum for filament made under the conditions illustrated in FIG. 3 (specifically for the values of the induced voltage observed in FIG. 3).

In the embodiment of the invention discussed above, we find that when the amplitude of the induced electrical impulses is less than 80 millivolts, the filament produced has relatively low tensile strength, but shows no degradation in contact with molten aluminum. When the amplitude of the impulses is greater than 100 millivolts, the filament produced is exceptionally strong, but degrades in contact with molten aluminum. When the amplitude of the induced electrical impulse is between the thresholds of 80 and 100 millivolts, the filament produced has both high tensile strength and resistance to adverse interactions with matrix materials. Measured induced electrical amplitudes are sensitive to many factors, including the temperature of the reactor electrode, the geometry of the sensing electrode, and the nature of the sensing circuit. Therefore, the values of voltage given are for illustration only, though the generic concept of using induced electrical impulses for control purposes can be generally applied.

The various features and advantages of the invention are thought to be clear from the foregoing description. Various other features and advantages not specifically enumerated will undoubtedly occur to those versed in the art, as likewise will many variations and modifications of the preferred embodiment illustrated, all of which may be achieved without departing from the spirit and scope of the invention as defined by the following claims:

We claim:

1. In a CVD reactor system for depositing a coating on a filament substrate in a heating zone within a reaction chamber to make a continuous filament, said substrate being heated by passing an electric current through the filament thereby defining a heating zone, the improvement comprising:
    a process control system having a pair of electrodes, at least one of which is outside the heating zone;
    voltage detection means coupled to said pair of electrodes for detecting a voltage induced between the electrodes;
    means for generating a control voltage in response to said induced voltage coupled to the voltage detection means; and
    means responsive to said control means for controlling a process parameter.

2. A system as described in claim 1 wherein said substrate is B, said deposit is $B_4C$, and said parameter is the flow of a hydrocarbon to the reactor.

3. A system as described in claim 2 wherein said hydrocarbon is methane and said flow is varied to maintain the induced voltage within a predetermined range.

4. A system as described in claim 1 wherein said substrate is a carbon monofilament and said deposit is silicon carbide.

5. A system as described in claim 1 wherein said substrate and deposit are made sequentially in the same heating zone.

6. In a CVD reactor system for depositing a coating on a filament substrate moving through a heating zone within a reaction chamber to make a continuous filament, said substrate being heated by passing an electric current through the filament thereby defining a heating zone, the improvement comprising:
    means for supplying boron-forming feedstock to said reactor to deposit boron on said substrate;
    means for blending a hydrocarbon and hydrogen with said boron-forming feedstock for depositing $B_4C$ on said boron;
    a process control system having a pair of electrodes, at least one of which is outside the heating zone,
    voltage detection means coupled to said pair of electrodes for detecting an induced voltage developed between the electrodes;
    means for generating a control voltage in response to said induced voltage; and
    means responsive to said control means for controlling the flow of hydrocarbon and/or hydrogen to said heating zone.

7. A system as described in claim 6 wherein said boron-forming feedstock includes $BCl_3$, and said hydrocarbon is methane.

8. In a CVD process for depositing a coating in a heating zone defined by an electrically-heated filament through which a heating current is supplied by a pair of spaced-apart electrodes, a process control method comprising:
    sensing voltage changes induced between two points on the filament where one of said points does not carry heating current;
    generating a control signal in response to said voltage changes; and
    using the control signal to control a process parameter.

9. In a process for depositing $B_4C$ on an electrically-heated boron filament moving through a heating zone by adding a hydrocarbon, a boron-forming feedstock, and hydrogen to the reaction zone, a method of controlling the process comprising:

sensing a voltage induced in said filament outside of the heating zone forming a control voltage responsive to the magnitude of the induced voltage; and using said control voltage to control the flow of the hydrocarbon and/or hydrogen to said reaction zone.

10. A system as described in claim 9 wherein the hydrocarbon is methane.

11. A system as described in claim 10 wherein said voltage amplitude is maintained within a predetermined range.

12. A system as described in claim 1 wherein said substrate is B, said deposit is $B_4C$, and said parameter is the flow of hydrogen to the reactor.

* * * * *